(12) United States Patent
Lan et al.

(10) Patent No.: US 11,477,920 B2
(45) Date of Patent: *Oct. 18, 2022

(54) POWER MODULE

(71) Applicant: Delta Electronics (Shanghai) CO., LTD, Shanghai (CN)

(72) Inventors: Lin Lan, Shanghai (CN); Weiqiang Zhang, Shanghai (CN); Quanliang Zhang, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 100 days.

This patent is subject to a terminal disclaimer.

(21) Appl. No.: 17/077,381

(22) Filed: Oct. 22, 2020

(65) Prior Publication Data

US 2021/0136960 A1   May 6, 2021

(30) Foreign Application Priority Data

Oct. 31, 2019 (CN) ......................... 201911055495.7

(51) Int. Cl.
*H05K 7/20* (2006.01)
*H05K 5/02* (2006.01)

(52) U.S. Cl.
CPC ....... *H05K 7/20909* (2013.01); *H05K 5/0213* (2013.01); *H05K 7/20145* (2013.01); *H05K 7/20172* (2013.01)

(58) Field of Classification Search
CPC ..... H01F 27/24; H01F 27/28; H05K 7/20909; H05K 7/20145; H05K 7/20172; H05K 5/0213

See application file for complete search history.

(56) References Cited

U.S. PATENT DOCUMENTS 4,521,954 A * 6/1985 Rademaker ............. H01F 41/04
29/605
2003/0213789 A1   11/2003 Andersen et al.
(Continued)

FOREIGN PATENT DOCUMENTS

CN    101710793 A    5/2010
CN    102158057 A    8/2011
(Continued)

OTHER PUBLICATIONS

The Extended European Search Report dated Mar. 19, 2021 from EP patent application No. 20204365.9.
(Continued)

*Primary Examiner* — Stephen S Sul
*Assistant Examiner* — Alexander Ryan Horton
(74) *Attorney, Agent, or Firm* — Qinghong Xu

(57) ABSTRACT

The present disclosure relates to the field of power electronics technology, and proposes a power module, including: a case and an isolating part disposed in the case; a first air duct and a second air duct stacked to each other, separated by the isolating part, and penetrated in a front-to-rear direction in the case; a high-voltage power unit; a low-voltage power unit; and a transformer, including a high-voltage portion and a low-voltage portion, wherein the high-voltage portion includes a first magnetic core and a high-voltage coil disposed on the first magnetic core, and the low-voltage portion includes a second magnetic core and a low-voltage coil disposed on the second magnetic core, wherein the high-voltage power unit and the high-voltage portion are disposed in the first air duct, and the low-voltage power unit and the low-voltage portion are disposed in the second air duct.

20 Claims, 14 Drawing Sheets

(56) References Cited

U.S. PATENT DOCUMENTS

| | | | |
|---|---|---|---|
| 2005/0168942 A1* | 8/2005 | Steinbrecher | H05K 7/20209 312/236 |
| 2008/0037219 A1 | 2/2008 | Chen et al. | |
| 2009/0159569 A1 | 6/2009 | Kurogi et al. | |
| 2012/0126617 A1 | 5/2012 | Peng | |
| 2015/0223366 A1 | 8/2015 | Horiuchi et al. | |
| 2015/0245537 A1 | 8/2015 | Sakuma et al. | |
| 2015/0348694 A1 | 12/2015 | Sakuma et al. | |
| 2016/0037677 A1 | 2/2016 | Yamanaka et al. | |
| 2018/0323022 A1 | 11/2018 | Skibinski et al. | |
| 2020/0158354 A1 | 5/2020 | Kurokawa et al. | |
| 2020/0343033 A1* | 10/2020 | Ettl | H01F 27/32 |
| 2020/0350830 A1 | 11/2020 | Hano et al. | |
| 2021/0136944 A1* | 5/2021 | Lan | H01F 27/24 |
| 2021/0167430 A1* | 6/2021 | Silha | H01M 50/204 |
| 2021/0219458 A1 | 7/2021 | Yan et al. | |

FOREIGN PATENT DOCUMENTS

| | | |
|---|---|---|
| CN | 202840910 U | 3/2013 |
| CN | 203014236 U | 6/2013 |
| CN | 203251558 U | 10/2013 |
| CN | 203377798 U | 1/2014 |
| CN | 104052292 A | 9/2014 |
| CN | 204578343 U | 8/2015 |
| CN | 205050689 U | 2/2016 |
| CN | 105810406 A | 7/2016 |
| CN | 106098316 A | 11/2016 |
| CN | 106953502 A | 7/2017 |
| CN | 107666235 A | 2/2018 |
| CN | 207218546 U | 4/2018 |
| CN | 207638544 U | 7/2018 |
| CN | 207852449 U | 9/2018 |
| CN | 208027854 U | 10/2018 |
| CN | 108831716 A | 11/2018 |
| CN | 109861557 A | 6/2019 |
| CN | 209267423 U | 8/2019 |
| CN | 106953502 B | 6/2020 |
| EP | 0794098 A1 | 9/1997 |
| EP | 1220574 A2 | 7/2002 |
| EP | 2487697 A1 | 8/2012 |
| JP | 2016082602 A | 5/2016 |
| TW | 201113913 A | 4/2011 |
| WO | 2004055965 A1 | 7/2004 |

OTHER PUBLICATIONS

The 1st Office Action dated Oct. 11, 2021 for CN patent application No. 201911056698.8.
The Notice of Allowance dated Oct. 11, 2021 for CN patent application No. 201911055495.7.
The 1st Office Action dated Dec. 1, 2021 for CN patent application No. 201911056710.5.
Non-Final Rejection dated Apr. 8, 2022 of U.S. Appl. No. 17/037,927.

* cited by examiner

POWER MODULE

CROSS-REFERENCE TO RELATED APPLICATIONS

The present application claims priority to Chinese Patent Application No. 201911055495.7 filed on Oct. 31, 2019, the entire contents thereof are incorporated herein by reference.

TECHNICAL FIELD

The present disclosure relates generally to the field of power electronics technology, and more particularly, to a power module.

BACKGROUND

At the present stage, especially in the field of medium voltage, a power module is mainly composed of a high-voltage power unit, a low-voltage power unit and a transformer. The power module has a high-voltage cavity and a low-voltage cavity, which are arranged side by side. The high-voltage power unit is located in the high-voltage cavity, and the low-voltage power unit and the transformer are located in the low-voltage cavity. The high-voltage power unit and the transformer are connected to each other by a cable.

SUMMARY

The present disclosure provides a power module, including:
a case and an isolating part disposed in the case;
a first air duct and a second air duct stacked to each other, separated by the isolating part, and penetrated in a front-to-rear direction in the case;
a high-voltage power unit;
a low-voltage power unit; and
a transformer, including a high-voltage portion and a low-voltage portion, wherein the high-voltage portion includes a first magnetic core and a high-voltage coil disposed on the first magnetic core, and the low-voltage portion includes a second magnetic core and a low-voltage coil disposed on the second magnetic core,
wherein the high-voltage power unit and the high-voltage portion are disposed in the first air duct, the low-voltage power unit and the low-voltage portion are disposed in the second air duct, the high-voltage coil is electrically connected to the high-voltage power unit, and the low-voltage coil is electrically connected to the low-voltage power unit.

In the power module according to the present disclosure, the interior of the case is divided into the first and second air ducts that are stacked to each other, and penetrated in a front-to-rear direction. The high-voltage power unit and the high-voltage portion are disposed in the first air duct, and the low-voltage power unit and the low-voltage portion are disposed in the second air duct. Namely, the high-voltage power unit with the high-voltage portion, and the low-voltage power unit with the low-voltage portion are respectively disposed in two different air ducts, which are separated by the isolating part. The separate first and second air ducts can not only prevent heat from being transferred to each other, but also ensure the circulation of air, thus accelerating heat dissipation of the case.

BRIEF DESCRIPTION OF THE DRAWINGS

Various objects, features and advantages of the present disclosure will become more apparent from the following detailed description of the preferred embodiments of the present disclosure taken in conjunction with the accompanying drawings. The drawings are only schematic illustrations of the present disclosure and are not necessarily drawn to scale. The same reference numbers will be used throughout the drawings to refer to the same or like parts. In the drawings.

DETAILED DESCRIPTION

Figure 1:
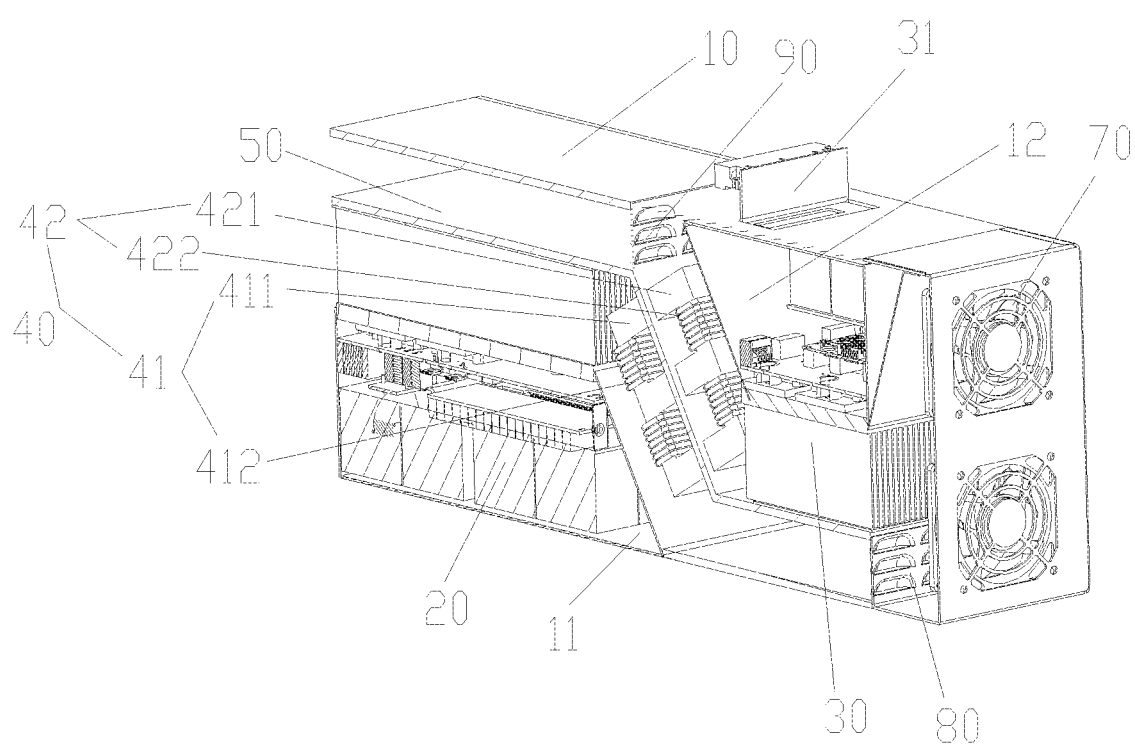
FIG. 1 is a schematic structural diagram illustrating the interior of a power module according to an exemplary embodiment.

Exemplary embodiments embodying features and advantages of the present disclosure will be described in detail in the following description. It should be understood that various changes can be made in different embodiments of the present disclosure without departing from the scope of the present disclosure, and the description and drawings therein are for illustration, rather than limiting the present disclosure.

Different exemplary embodiments of the present disclosure will be described below by reference to the accompanying drawings, which form part of the present disclosure. Different exemplary structures, systems and steps that implement various aspects of the present disclosure are shown by way of example. It should be understood that other specific solutions of components, structures, exemplary devices, systems, and steps may be used and structural and functional modifications can be made without departing from the scope of the present disclosure. Moreover, although terms "above", "between", "within", etc. may be used herein to describe various exemplary features and elements of the present disclosure, the terms are used herein for convenience only, for example, according to a direction of an example in the drawings. Any content of this specification should not be understood as that only a particular three-dimensional direction of a structure is looked as falling within the scope of the present disclosure.

The inventor of the disclosure found that the existing power module has the following disadvantages: (1) the sequential arrangement of the internal components of the power module leads to a large height and size, so that the power module is difficult to be moved, and the high-voltage cavity is very deep so that the cable and optical fiber is difficult to be connected and fixed. (2) The use of shielding solid insulation leads to a large size, a heavy weight and a high price of the module. (3) The heat dissipation capability of the power module is poor.

One or more embodiments of the present disclosure provide a power module. Referring to FIGS. 1 to 14, the power module includes: a case 10 and an isolating part 50 disposed in the case 10; first and second air ducts 11 and 12 stacked to each other, separated by the isolating part 50, and penetrated in a front-to-rear direction in the case 10; a high-voltage power unit 20; a low-voltage power unit 30; and a transformer 40 including a high-voltage portion 41 and a low-voltage portion 42. The high-voltage portion 41 includes a first magnetic core 411 and a high-voltage coil 412 disposed on the first magnetic core 411. The low-voltage portion 42 includes a second magnetic core 421 and a low-voltage coil 422 disposed on the second magnetic core 421. The high-voltage power unit 20 and the high-voltage portion 41 are disposed in the first air duct 11. The low-voltage power unit 30 and the low-voltage portion 42 are disposed in the second air duct 12. The high-voltage coil 412 is electrically connected to the high-voltage power unit 20. The low-voltage coil 422 is electrically connected to the low-voltage power unit 30.

In the power module according to the embodiments of the present disclosure, the interior of the case 10 is divided into the first and second air ducts 11 and 12 that are stacked to each other, and penetrated in a front-to-rear direction. The high-voltage power unit 20 and the high-voltage portion 41 are disposed in the first air duct 11, and the low-voltage power unit 30 and the low-voltage portion 42 are disposed in the second air duct 12. Namely, the high-voltage power unit 20 with the high-voltage portion 41, and the low-voltage power unit 30 with the low-voltage portion 42 are respectively disposed in two different air ducts, which are separated by the isolating part 50. The separate first and second air ducts 11 and 12 can not only prevent heat from being transferred to each other, but also ensure the circulation of air, thus accelerating heat dissipation of the case 10. The power module is divided into two separate air ducts, which avoids respective power units from dissipating heat in series with one another and effectively improves the heat dissipation capability and the overall heat dissipation efficiency of the power module, which in turn can increase power density of the power module.

In some embodiments, both the first and second air ducts 11 and 12 are penetrated in a front-to-rear direction. That is, both the front portion and the rear portion of the case 10 have ventilation openings, which ensures the reliable circulation of air. The first and second air ducts 11 and 12 are disposed in such a manner that they are stacked one on top of the other, but it is not limited thereto.

As shown in FIGS. 2-4 and 12, the isolating part 50 is formed of insulating material. The power module further includes semi-conductive layers 60 which are provided on both sides of the isolating part 50. The high-voltage portion 41 and the low-voltage portion 42 are in contact with the semi-conductive layers 60 respectively.

In the embodiments, the isolating part 50 and the semi-conductive layers 60 are used to electrically isolate the high-voltage portion 41 from the low-voltage portion 42. The isolating part 50 is further used to adjust a gap between the high-voltage portion 41 and the low-voltage portion 42 to regulate a leakage inductance of the transformer 40. By providing the semi-conductive layers 60, electric field of the high-voltage portion 41 and the low-voltage portion 42 can be evenly distributed on the isolating part 50, which can not only prevent the partial discharge, but also ensure the uniform distribution of the electric field.

In the embodiments, the isolating part 50 formed by insulating material can isolate the high voltage from the low voltage, such that the transformer 40 does not need to adopt the shielding solid insulation method, that is, there is no need to cover with any insulation shields, and the cooling air may directly dissipate heat from the first magnetic core 411, the high-voltage coil 412, the second magnetic core 421 and the low-voltage coil 422, which avoids the bottleneck of heat dissipation of the shielding solid insulation. The high-voltage power unit 20 is disposed without being enclosed by an insulation shielding case, thus the size and weight are significantly reduced, and the costs are also reduced, then the power density can be greatly increased.

As for the specific way of providing the semi-conductive layers 60, the semi-conductive layers 60 are disposed at least in regions where the isolating part 50 is in contact with the first magnetic core 411 and the second magnetic core 421 respectively.

In some embodiments, the semi-conductive layer 60 is disposed between the isolating part 50 and the first magnetic core 411. Namely, the first magnetic core 411 is in contact with the isolating part 50 through the semi-conductive layer 60. Specifically, the first magnetic core 411 has an end portion, and the semi-conductive layer 60 is sandwiched between the end portion of the first magnetic core 411 and the isolating part 50. A projection of the end portion on the isolating part 50 is located entirely on the semi-conductive layer 60. Namely, the semi-conductive layer 60 may have an area larger than or equal to that of the end portion of the first magnetic core 411. The first magnetic core 411 may have a plurality of end portions. There may be a plurality of corresponding semi-conductive layers 60 to match the end portions, but also the semi-conductive layers 60 may be formed in a whole. Similarly, the semi-conductive layer 60 is disposed between the isolating part 50 and the second magnetic core 421. Namely, the second magnetic core 421 is in contact with the isolating part 50 through the semi-conductive layer 60. The second magnetic core 421 has an end portion, and the semi-conductive layer 60 is sandwiched between the end portion of the second magnetic core 421 and the isolating part 50. A projection of the end portion on the isolating part 50 is located entirely on the semi-conductive layer 60. Namely, the semi-conductive layer 60 may have an area larger than or equal to that of the end portion of the second magnetic core 421. The second magnetic core 421 may have a plurality of end portions. There may be a plurality of corresponding semi-conductive layers 60 to match the end portions, but the semi-conductive layers 60 may be formed in a whole.

Figure 12:
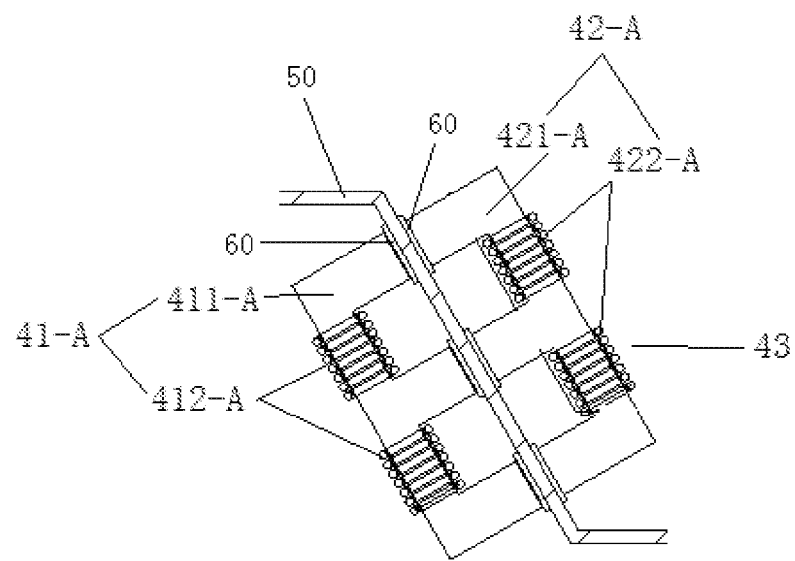
FIG. 12 is a schematic structural diagram illustrating a main transformer of a power module according to an exemplary embodiment.

In some embodiments, as shown in FIG. 12, the transformer 40 includes a main transformer 43 located in the case 10. The main transformer 43 includes a main high-voltage portion 41-A and a main low-voltage portion 42-A. The main high-voltage portion 41-A includes a first main magnetic core 411-A and a main high-voltage coil 412-A disposed on the first main magnetic core 411-A. The main low-voltage portion 42-A includes a second main magnetic core 421-A and a main low-voltage coil 422-A disposed on the second main magnetic core 421-A. The main high-voltage coil 412-A is electrically connected to the high-voltage power unit 20, particularly, to a main power circuit of the high-voltage power unit 20. The main low-voltage coil 422-A is electrically connected to the low-voltage power unit 30, particularly, to a main power circuit of the low-voltage power unit 30.

Figure 11:
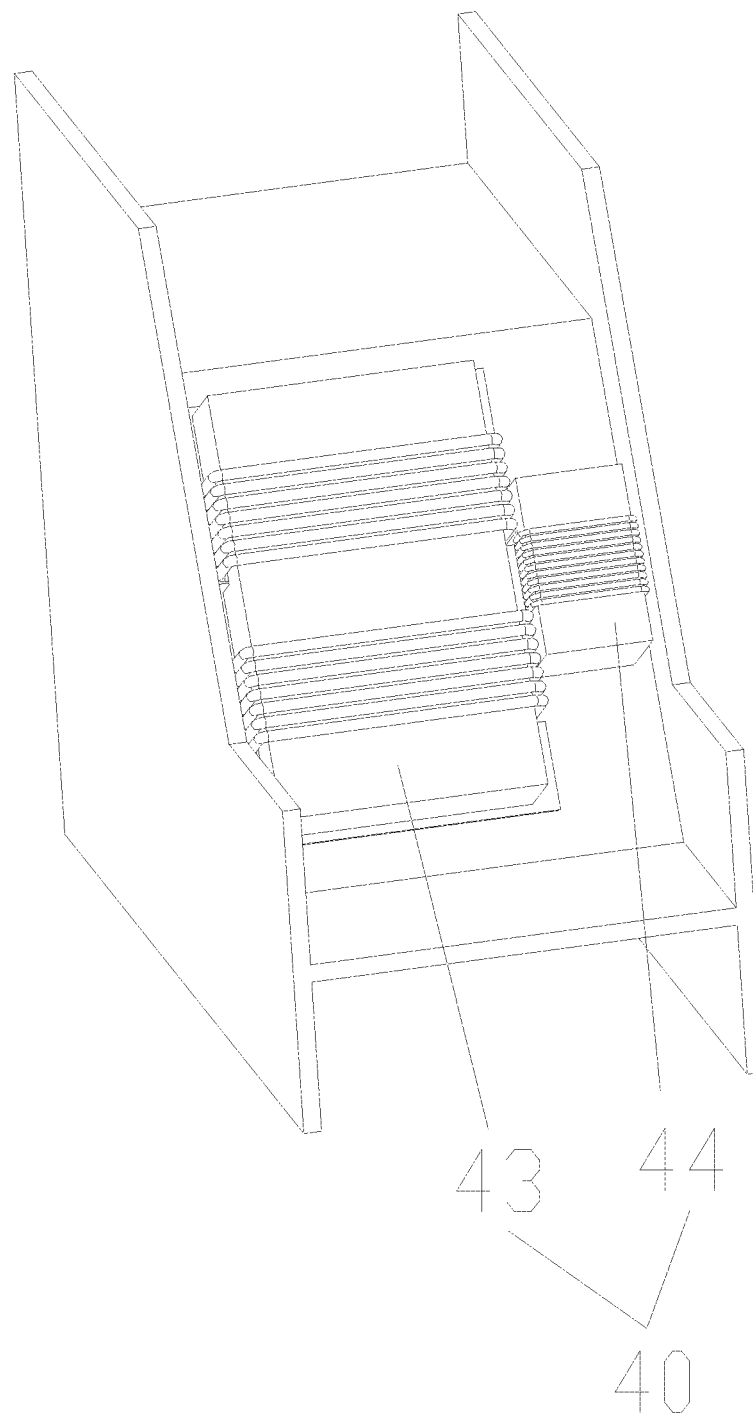
FIG. 11 is a schematic partial structural diagram illustrating a power module according to an exemplary embodiment.
Figure 13:
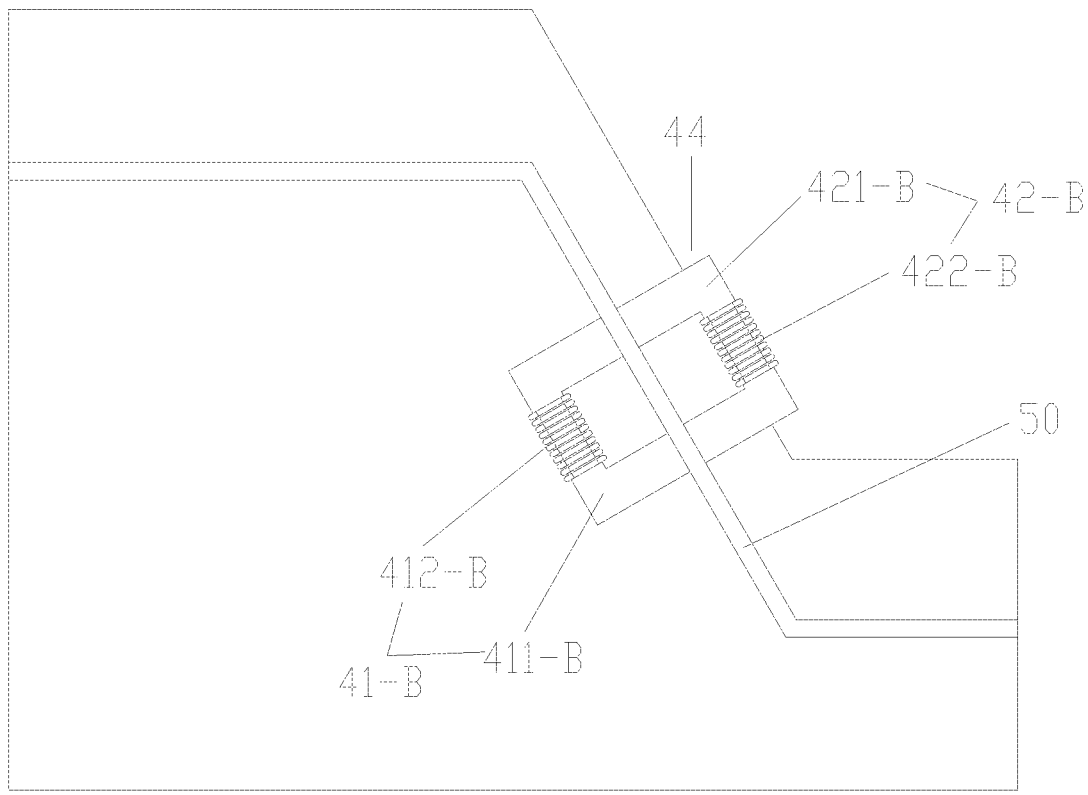
FIG. 13 is a schematic structural diagram illustrating an auxiliary transformer of a power module shown in FIG. 11.
Figure 14:
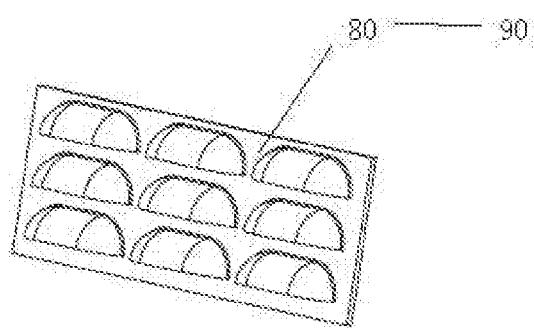
FIG. 14 is a schematic structural diagram illustrating a partition plate of a power module according to an exemplary embodiment.

In some embodiments, as shown in FIGS. 11 to 13, besides the transformer 40 includes the main transformer 43 in the case 10, the transformer 40 further includes an auxiliary transformer 44 in the case 10. The high-voltage portion 41 includes the main high-voltage portion 41-A and an auxiliary high-voltage portion 41-B. The low-voltage portion 42 includes the main low-voltage portion 42-A and an auxiliary low-voltage portion 42-B. The main high-voltage portion 41-A and the main low-voltage portion 42-A are respectively a high-voltage portion and a corresponding low-voltage portion of the main transformer 43. The auxiliary high-voltage portion 41-B and the auxiliary low-voltage portion 42-B are respectively a high-voltage portion and a corresponding low-voltage portion of the auxiliary transformer 44. The auxiliary high-voltage portion 41-B includes a first auxiliary magnetic core 411-B and an auxiliary high-voltage coil 412-B. The auxiliary low-voltage portion 42-B includes a second auxiliary magnetic core 421-B and an auxiliary low-voltage coil 422-B. The main high-voltage coil 412-A and the main low-voltage coil 422-A are respectively electrically connected to the main power circuits of the high-voltage power unit 20 and the low-voltage power unit 30, which is used to realize power transmission of the main power circuits. The auxiliary high-voltage coil 412-B and the auxiliary low-voltage coil 422-B are respectively electrically connected to auxiliary power supply circuits of the high-voltage power unit 20 and the low-voltage power unit 30, which is used to realize power transmission of the auxiliary power supply circuits. Thus, a power supply may be provided for controlling and driving the main power circuits.

In some embodiments, the transformer 40 includes only the main transformer 43 and there may be one or more main transformers 43. In other embodiments, the transformer 40 includes both the main transformer 43 and the auxiliary transformer 44, and there may be one or more main transformers 43 or one or more auxiliary transformers 44. In addition, the main transformers 43 may be arranged side by side and electrically connected to a plurality of main power circuits in the high/low-voltage power unit respectively, or, may be arranged side by side and electrically connected to one main power circuit in the high/low-voltage power unit at the same time. The auxiliary transformers 44 may be arranged side by side and electrically connected to a plurality of auxiliary power supply circuits in the high/low-voltage power unit, or, may be arranged side by side and electrically connected to the same auxiliary power supply circuit in the high/low-voltage power unit.

In some embodiments, the main transformer 43 and the auxiliary transformer 44 share the isolating part 50, and they are arranged side by side, so on the one hand, the auxiliary transformer 44 can be integrated into the power module, which results in that the power system is more modular. On the other hand, a power cable of the auxiliary power can be shortened and the space occupation of the power module can be reduced, thus the power density of the power module is improved.

Figure 4:
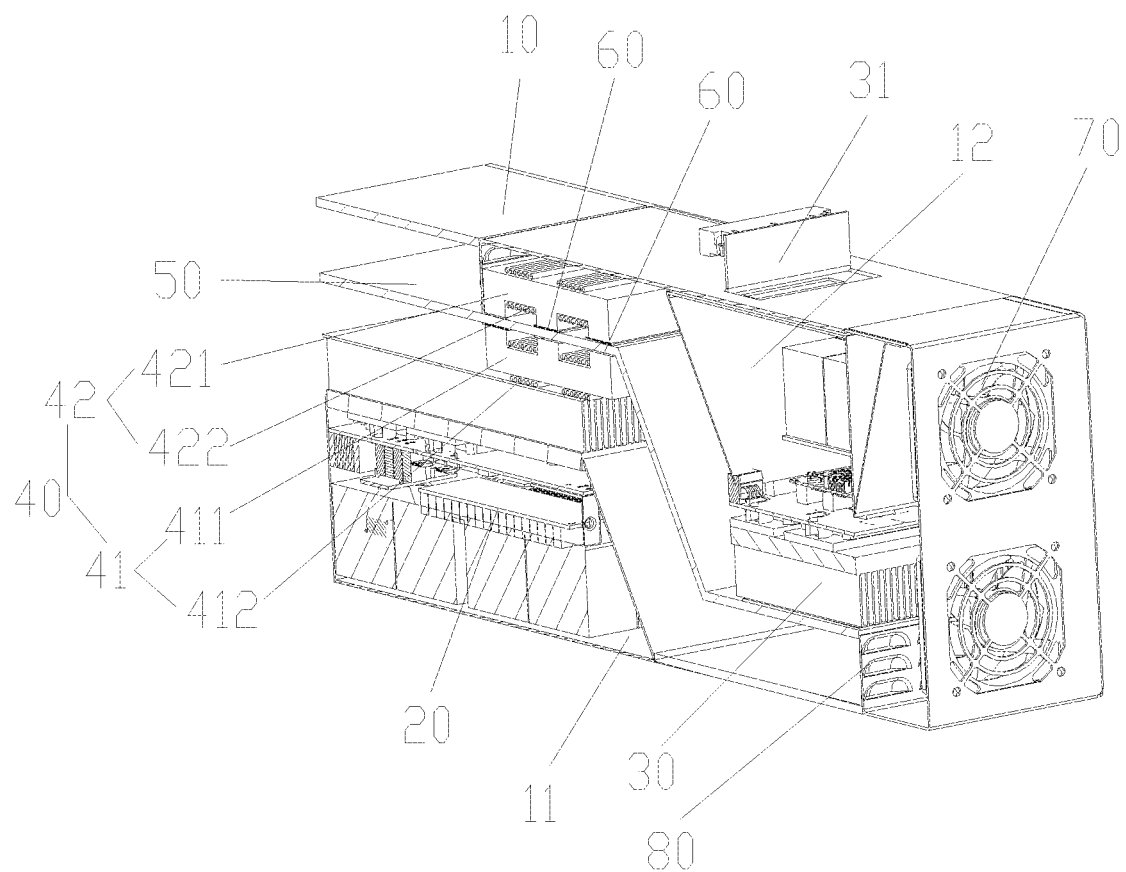
FIG. 4 is a schematic structural diagram illustrating the interior of a power module according to another exemplary embodiment.

As shown in FIGS. 1 and 4, the power module further includes a fan assembly 70. The fan assembly 70 includes a fan having an air inlet/outlet in communication with both the front portion of the first air duct 11 and the second air duct 12.

In the embodiment, the fan is used to blow cold air into or suck hot air out of the first air duct 11 and the second air duct 12. Namely, the air inlet/outlet of the fan can be used for blowing air or sucking air depending on specific heat dissipation environment and heat dissipation time, and it is only necessary to ensure the circulation of air inside the first and second air ducts 11 and 12.

In the embodiments of present disclosure, two end portions of the air duct are defined as a front portion and a rear portion in a length direction of the air duct, i.e., a front portion and a rear portion of the first air duct 11 and a front portion and a rear portion of the second air duct 12.

Figure 2:
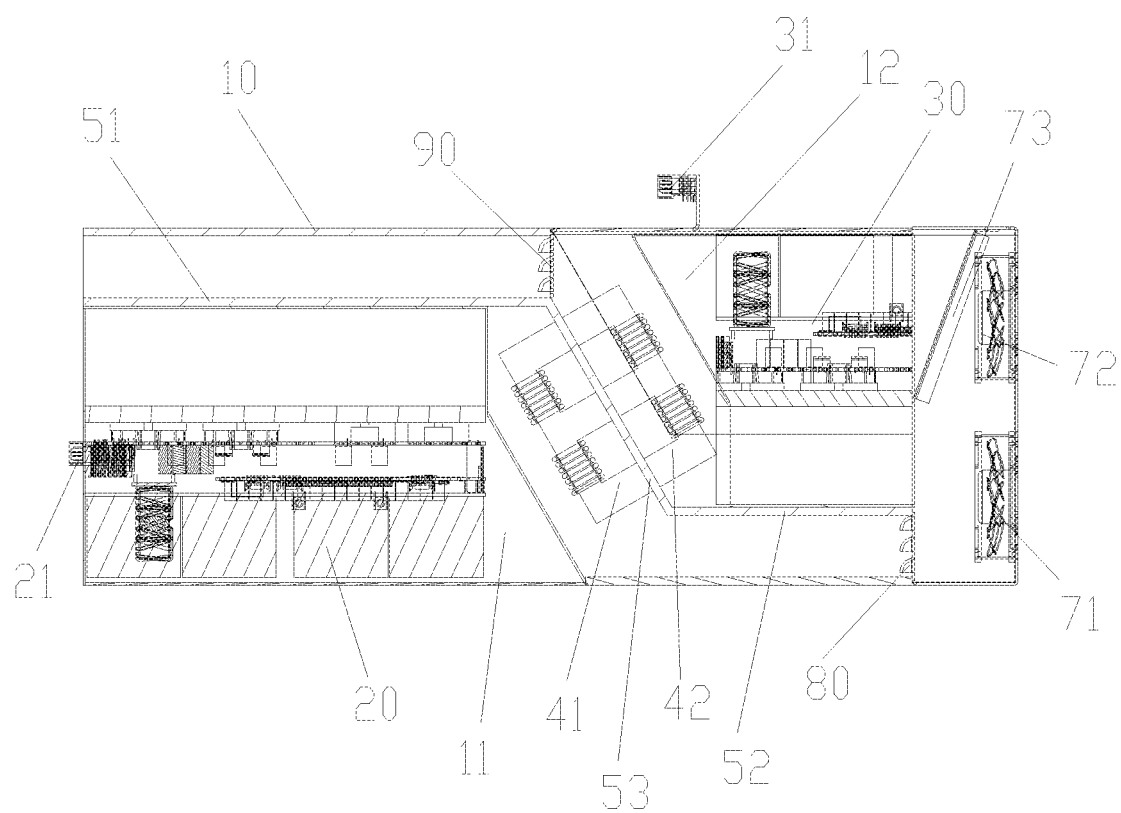
FIG. 2 is a schematic structural diagram illustrating a cross section of a power module according to an exemplary embodiment.
Figure 5:
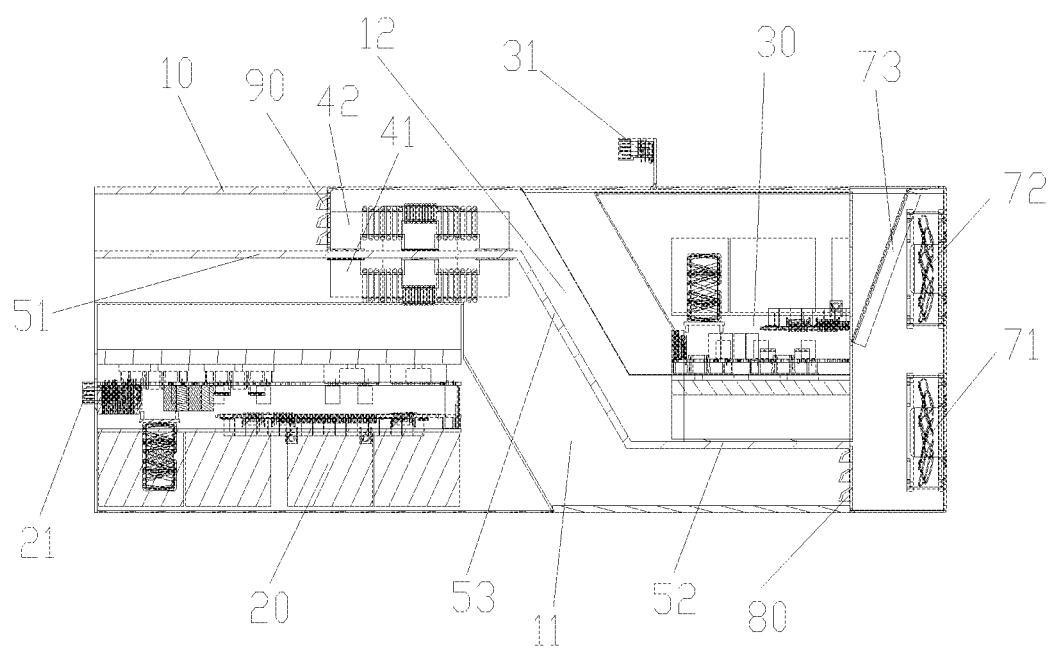
FIG. 5 is a schematic structural diagram illustrating a cross section of a power module according to another exemplary embodiment.

As shown in FIGS. 2 and 5, the fan includes a first fan 71 which has an air inlet/outlet located in the front portion of the first and second air ducts 11 and 12. Moreover, an air-in/out direction of the first fan 71 is parallel to a length direction of the case 10, i.e., parallel to a front-to-rear direction of the first and second air ducts 11 and 12.

In the embodiments, the air inlet/outlet of the first fan 71 directly blows air into or suck air out of the first and second air ducts 11 and 12. The front-to-rear direction of the first and second air ducts 11 and 12 is an inflow or outflow direction of airflow.

In one or more embodiments, the fan further includes a second fan 72, which is located in the front portion of the first air duct 11 and the second air duct 12, and is disposed side by side with the first fan 71. The installation of the first and second fans 71 and 72 may ensure that sufficient cold air can be blown into or sufficient hot air can be sucked out of the first and second air ducts 11 and 12. Namely, the circulation of air in the air ducts should be ensured.

Figure 8:
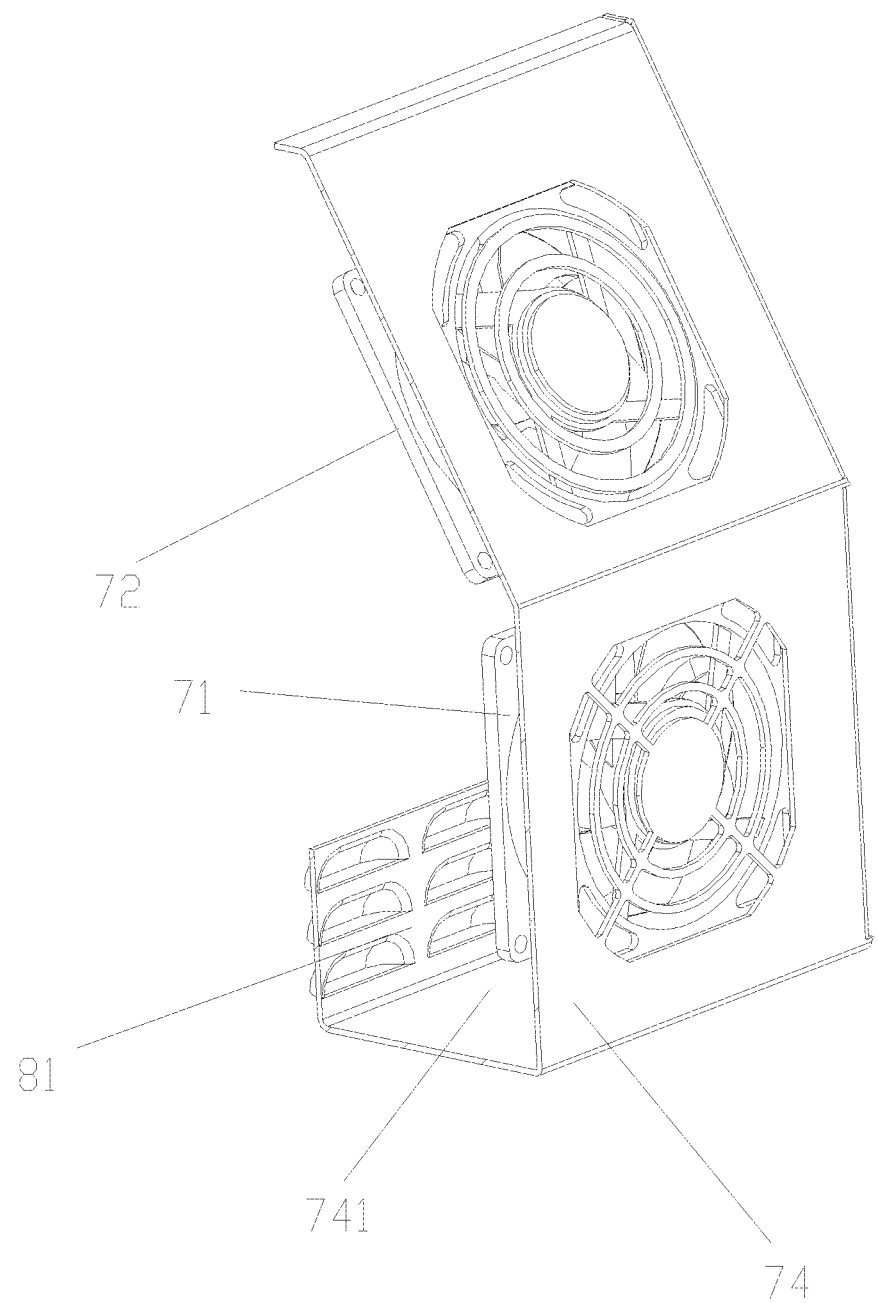
FIG. 8 is a schematic structural diagram illustrating the interior of a fan assembly according to an exemplary embodiment.
Figure 9:
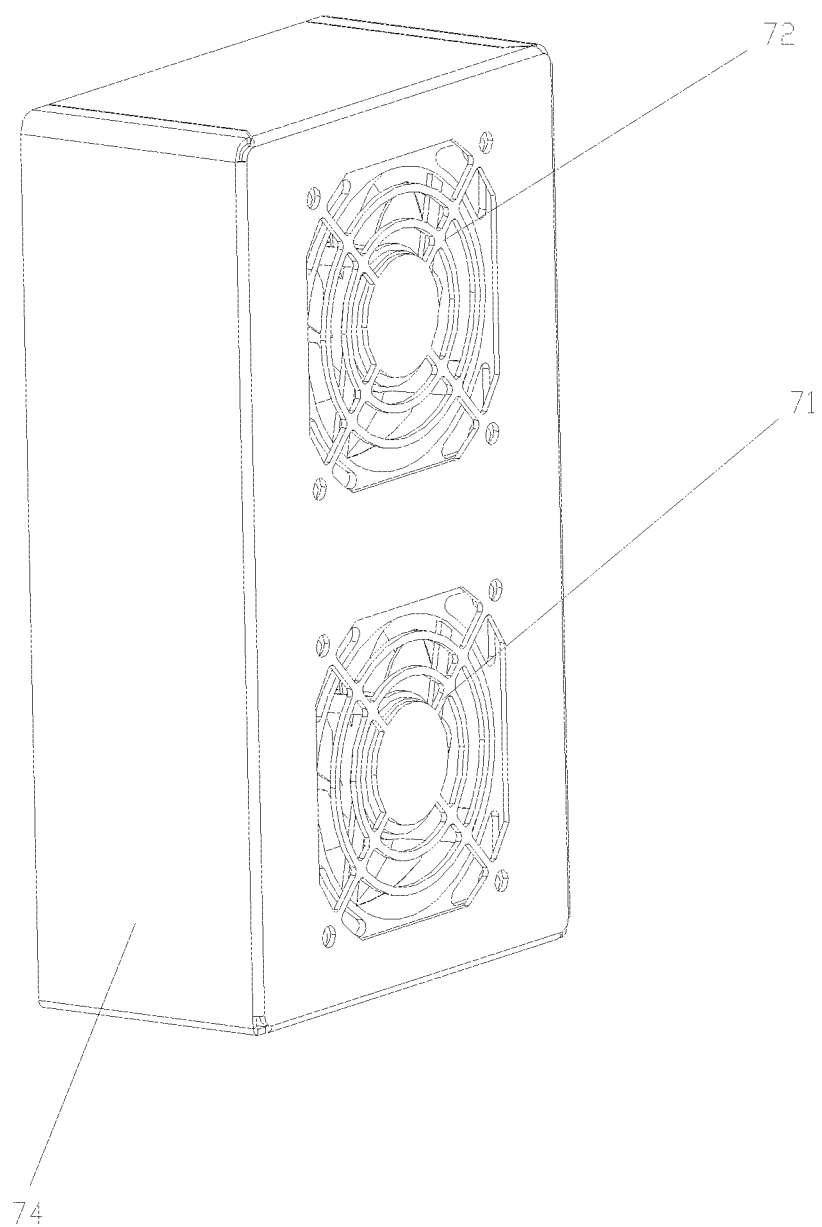
FIG. 9 is a schematic structural diagram illustrating a fan assembly according to another exemplary embodiment.

As for the position at which the second fan 72 is disposed, as shown in FIG. 8, the air inlet/outlet of the second fan 72 is inclined relative to the air inlet/outlet of the first fan 71, and is inclined to the front of the first and second air ducts 11 and 12. The air inlet/outlet of the second fan 72 are obliquely disposed, to ensure that air blown into or sucked out of the second fan 72 flows through the first and second air ducts 11 and 12 more easily.

Figure 10:
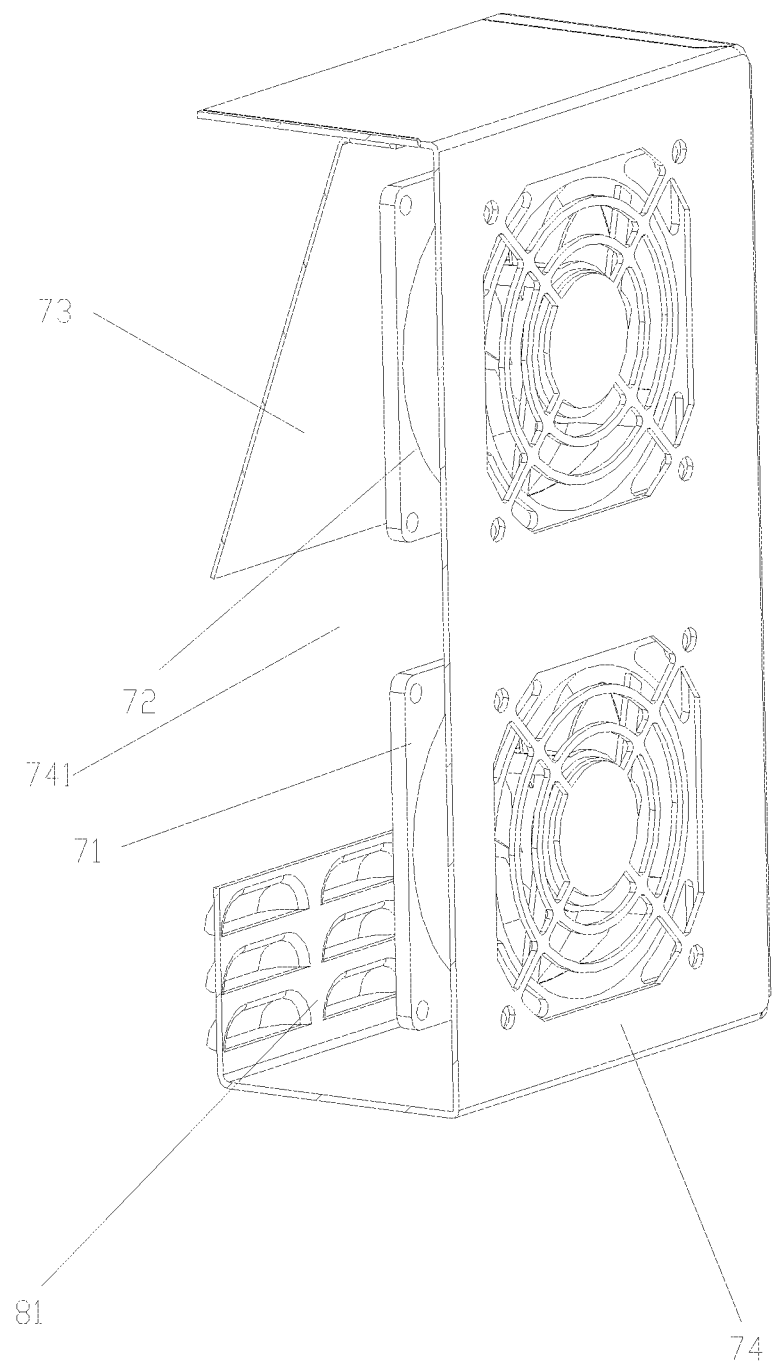
FIG. 10 is a schematic structural diagram illustrating the interior of a fan assembly according to another exemplary embodiment.

As shown in FIG. 10, the air inlet/outlet of the second fan 72 is disposed parallel to the air inlet/outlet of the first fan 71. The fan assembly 70 further includes an air guide plate 73. The air guide plate 73 is inclined relative to the air inlet/outlet of the second fan 72, such that the cold air is blown into the first and second air ducts 11 and 12 via the air guide plate 73 from the air inlet/outlet of the second fan 72, or, hot air generated by the power units and transformer in the ducts is sucked out of the air inlet/outlet of the second fan 72 via the air guide plate 73.

In the embodiment shown in FIG. 10, the second fan 72 is disposed in the same way as that of the first fan 71. In this way, the air inlet/outlet of the second fan 72 will face one air duct. Therefore, the inclined air guide plate 73 is provided for guiding air, in order to make it easier for air blown into or sucked out of the air inlet/outlet of the second fan 72 to run through both the first and second air ducts 11 and 12. An angle of the air guide plate 73 is adjustable.

In one or more embodiments, the cross section of the front portion of the first air duct 11 is smaller than the cross section of the front portion of the second air duct 12. The air inlet/outlet of the first fan 71 faces both the front portion of the first air duct 11 and the front portion of the second air duct 12. Furthermore, the second fan 72 and the first fan 71 are disposed side by side up and down. Therefore, the second fan 72 may be obliquely disposed, or, an air guide plate 73 may be provided for guiding air, in order to allow air blown into or sucked out of the air inlet/outlet of the second fan 72 to flow through both the first and second air ducts 11 and 12.

In some embodiments, the fan assembly 70 is disposed at a side of the case 10 close to the low-voltage power unit 30. The fan assembly 70 is disposed at such a position for the purpose of, on the one hand, taking safety problem into consideration, and on the other hand, reducing the size of the power module in its length direction. Namely, compared with the situation where the fan assembly 70 is placed at a side close to the high-voltage power unit 20, the arrangement that the fan assembly 70 is placed at the side close to the low-voltage power unit 30 requires smaller electrical clearance and shorter creepage distance, which then reduces the size of the power module in its length direction.

In some embodiments, the number of fans may be increased or decreased according to different power levels.

As shown in FIGS. 1 and 2, the fan assembly 70 is disposed in the case 10. The power module further includes a first partition plate 80, which is disposed close to the fan assembly 70 in the first air duct 11. Both the high-voltage power unit 20 and the high-voltage portion 41 are located on the same side of the first partition plate 80, and on a side opposite to the side at which the fan assembly 70 is located. A first air guide hole in communication with the front portion of first air duct 11 is disposed on the first partition plate 80.

In the embodiment, although the first and second air ducts 11 and 12 are two separate air ducts, they are in communication with the outside, to ensure the circulation of air. Therefore, during the actual use, the high-voltage power unit 20 and the high-voltage portion 41 may discharge electricity to the low-voltage power unit 30, the low-voltage portion 42 and the interior of the fan assembly 70, which affects the normal operation of the low-voltage power unit 30, the low-voltage portion 42 and the fans. The first partition plate 80 may be provided for further preventing this problem, that is, for providing further division of a high-voltage region (including the high-voltage power unit 20 and the high-voltage portion 41) and a low-voltage region (including the low-voltage power unit 30 and the low-voltage portion 42).

In some embodiments, a plurality of the first air guide holes may be disposed on the first partition plate 80.

As for the specific structure of the fan assembly 70, as shown in FIGS. 7 to 10, the fan assembly 70 further includes: a mounting portion 74, wherein the fans are disposed in the mounting portion 74, and the mounting portion 74 is connected to the case 10. An air vent 741 in communication with the first and second air ducts 11 and 12 is disposed on the mounting portion 74.

In one or more embodiments, the fan assembly 70 and the case 10 are two mutually separate arrangements. That is to say, the fan assembly 70 is connected to the case 10 through the mounting portion 74, and can be disassembled at any time during the specific use. Both the first fan 71 and the second fan 72 are disposed on the mounting portion 74.

In some embodiments, when the air inlet/outlet of the first fan 71 and the second fan 72 are disposed parallel to each other, the air guide plate 73 is disposed on the mounting portion 74 as well.

In some embodiments, as shown in FIGS. 8 and 10, at least a portion of the air vent 741 is an opening. The power module further includes a second partition plate 81, which is disposed on the mounting portion 74 and is used to block a part of the opening. A second air guide hole in communication with the front portion of the first air duct 11 is disposed on the second partition plate 81. The second partition plate 81 may be provided to isolate the first air duct 11 from the air vent 741, that is, to prevent the high-voltage region from internally discharging electricity to the low-voltage region and the interior of the fan assembly 70, thereby improving safety performance of the power module.

In some embodiments, a plurality of second air guide holes may be disposed on the second partition plate 81.

As for the way of disposing the first and second air ducts 11 and 12, the first air duct 11 is located under the second air duct 12, or, the first air duct 11 is located above the second air duct 12. Here "above" and "under" may indicate the arrangement relationship of a local structure as well, and it is not excluded that the first and second air ducts 11 and 12 are located on the same horizontal plane.

As for the specific structure of the isolating part 50, the isolating part 50 is a bent plate and the high-voltage power unit 20 and the low-voltage power unit 30 are successively disposed in the length direction of the case 10. Such arrangement can decrease the volume of the power module.

As shown in FIGS. 2 and 5, the isolating part 50 includes: a first plate 51, which is disposed on the case 10 and extends in the length direction of the case 10; a second plate 52, which is disposed on the case 10 and extends in the length direction of the case 10, wherein the first plate 51 and the second plate 52 are successively disposed in a height direction of the case 10; and a third plate 53, which is disposed on the case 10 to connect the first and second plates 51 and 52, wherein the third plate 53 is obliquely disposed relative to the first and second plates 51 and 52. The high-voltage power unit 20 and the low-voltage power unit 30 are respectively located on both sides of the third plate 53, that is, the high-voltage power unit 20 and the low-voltage power unit 30 are respectively located on both sides of the isolating part 50.

In the embodiments, the isolating part 50 divides the case 10 into an upper part and a lower part, where the first air duct 11 may be located below the second air duct 12 or above the second air duct 12.

As for positions at which the high-voltage portion 41 and the low-voltage portion 42, the high-voltage portion 41 and the low-voltage portion 42 are respectively located on both sides of the first plate 51. Alternatively, the high-voltage portion 41 and the low-voltage portion 42 are respectively located on both sides of the second plate 52. Alternatively, the high-voltage portion 41 and the low-voltage portion 42 are respectively located on both sides of the third plate 53.

In some embodiments, as shown in FIGS. 4 and 5, the high-voltage portion 41 and the low-voltage portion 42 are respectively located on both sides of the first plate 51. That is, both the high-voltage portion 41 and the low-voltage portion 42 are disposed in a horizontal direction. The high-voltage power unit 20 and the high-voltage portion 41 dissipate heat in the first air duct 11. The low-voltage power unit 30 and the low-voltage portion 42 dissipate heat in the second air duct 12.

In some embodiments, the high-voltage portion 41 and the low-voltage portion 42 are respectively located on both sides of the second plate 52.

In some embodiments, it is easier for the high-voltage portion 41 and the low-voltage portion 42 to be fixed when they are horizontally placed.

In some embodiments, as shown in FIGS. 1 and 2, the high-voltage portion 41 and the low-voltage portion 42 are respectively located on both sides of the third plate 53. That is, the high-voltage portion 41 and the low-voltage portion 42 are inclined relative to a horizontal plane. At this time, the high-voltage portion 41 and the low-voltage portion 42 can effectively utilize the internal space of the air ducts and meet the requirements of the creepage distance, thereby decreasing an overall volume of the case 10.

As shown in FIGS. 2 and 5, the power module further includes a third partition plate 90, which is disposed in the second air duct 12 for dividing the second air duct 12 into two parts. Both the low-voltage power unit 30 and the low-voltage portion 42 are located on the same side of the third partition plate 90. A third air guide hole is disposed on the third partition plate 90.

In some embodiments, the third partition plate 90 is provided to prevent the high-voltage region from discharging electricity to the low-voltage region, and to ensure the normal operation in the low-voltage region. That is, the third partition plate 90 further divides the high-voltage region and the low-voltage region, and its function is similar to that of the first partition plate 80 or the second partition plate 81.

In some embodiments, there may be a plurality of third air guide holes provided on the third partition plate 90.

In some embodiments, the third partition plate 90 is located at a position close to the low-voltage power unit 30 in the second air duct 12. The third partition plate 90, the case 10, the mounting portion 74 and the first partition plate 80 (or the second partition plate 81) divide the interior of the case 10 into the low-voltage region and the high-voltage region. Both the first partition plate 80 (or the second partition plate 81) and the third partition plate 90 are made of metal material. The partition plates are a perforated structure such as a shutter, which ensures that the high-voltage power unit cannot be directly seen from the perspective of the low-voltage power unit. In the power module, the high-voltage region and the low-voltage region are isolated from each other and the partition plates are added, which improves the safety of the power module, and prevents the high-voltage region from discharging electricity to the low-voltage region. The perforated structure of the partition plates can ensure both the requirements of heat dissipation and safety of the power module.

In one embodiment, the first plate 51 is located above the second plate 52. The second air duct 12 and the first air duct 11 are respectively located on the upper and lower sides of the first plate 51, the third plate 53 and the second plate 52. The high-voltage power unit 20 is located below the first plate 51, and the low-voltage power unit 30 is located above the second plate 52. Alternatively, the first and second air ducts 11 and 12 are respectively located on the upper and lower sides of the first plate 51, the third plate 53 and the second plate 52. The low-voltage power unit 30 is located below the first plate 51, and the high-voltage power unit 20 is located above the second plate 52. The fan assembly 70 is disposed at a side of the case 10 close to the low-voltage power unit 30.

Figure 3:
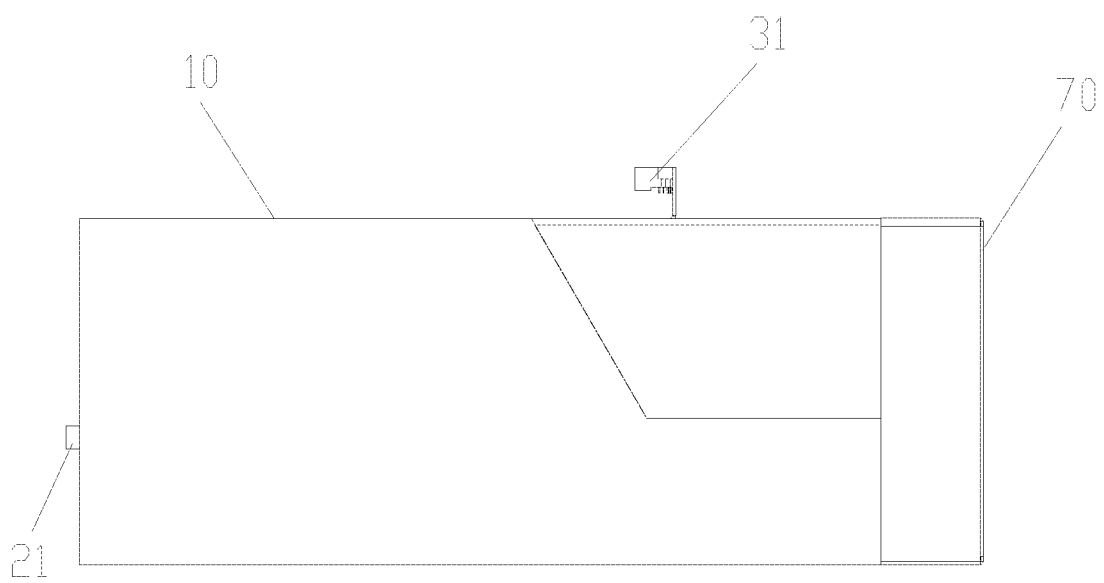
FIG. 3 is a schematic structural diagram illustrating a power module according to an exemplary embodiment.
Figure 6:
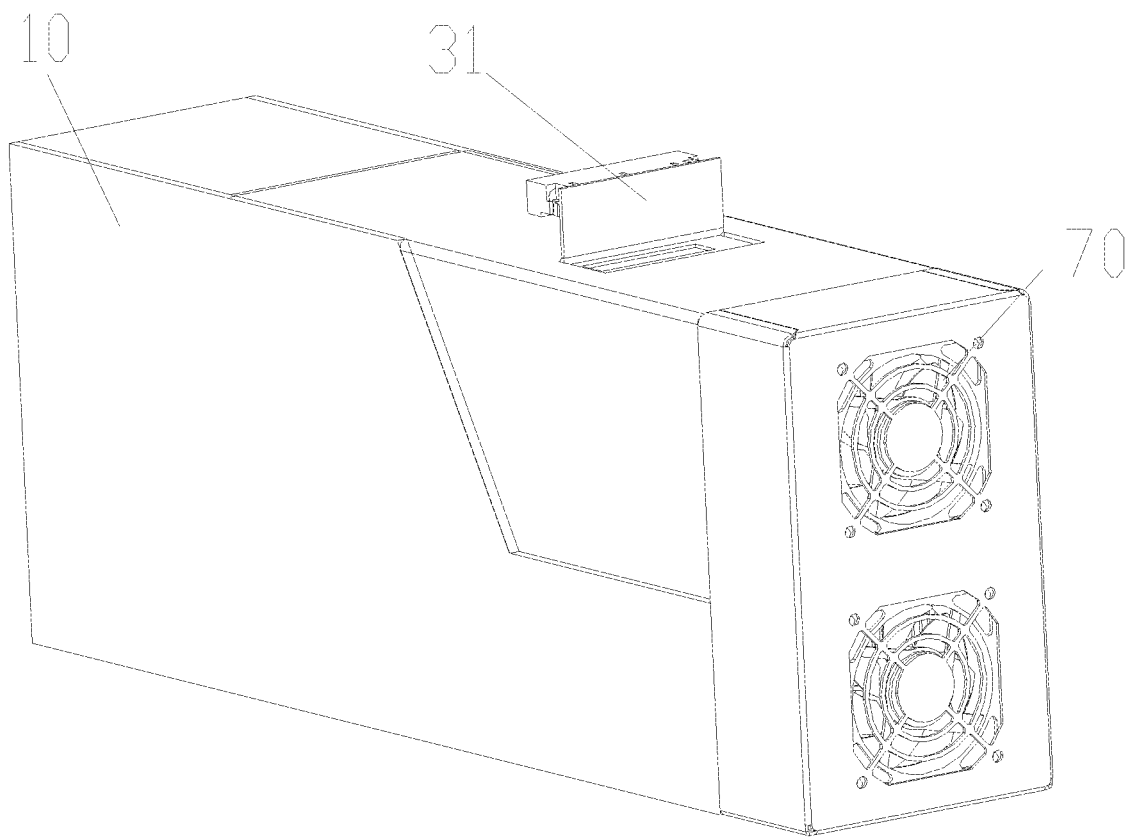
FIG. 6 is a schematic structural diagram illustrating a power module according to another exemplary embodiment.
Figure 7:
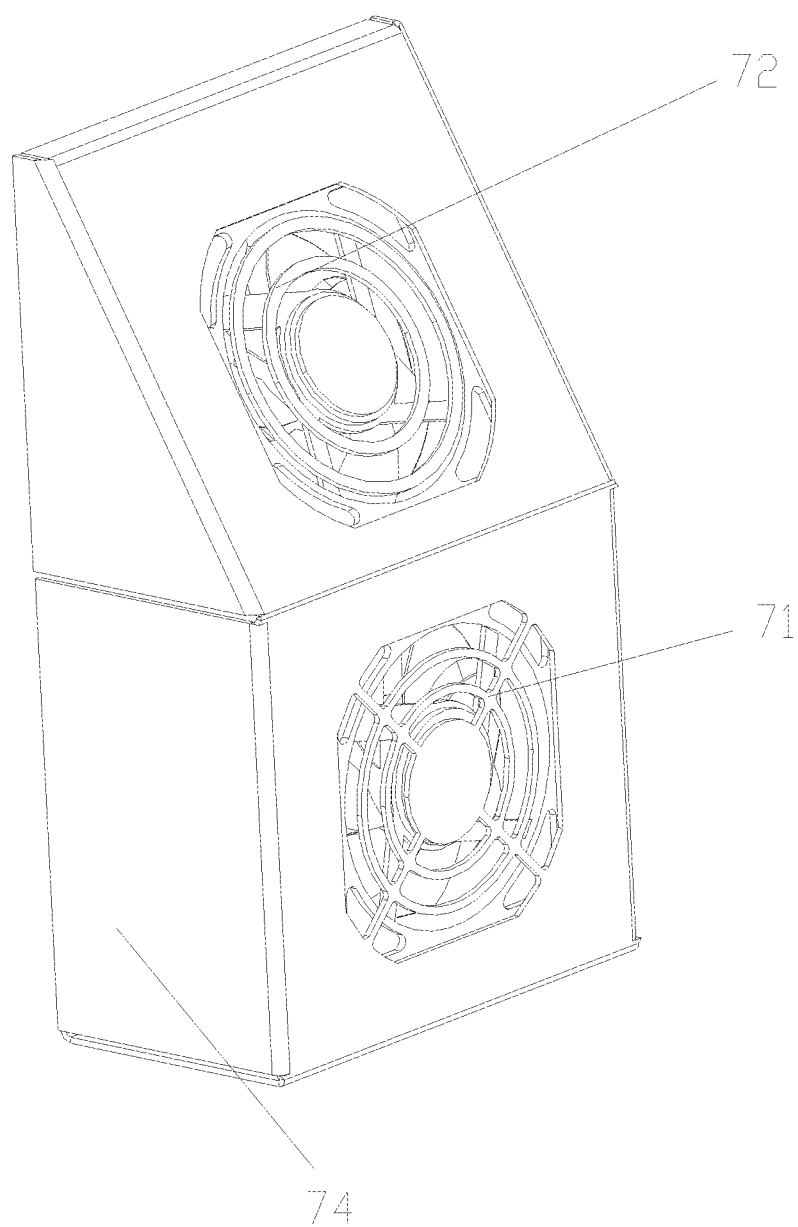
FIG. 7 is a schematic structural diagram illustrating a fan assembly according to an exemplary embodiment.

As shown in FIGS. 3 and 6, the power module further includes a high-voltage input terminal 21, which is electrically connected to the high-voltage power unit 20, and protruding from a side surface or a rear portion of the case 10; and a low-voltage output terminal 31, which is electrically connected to the low-voltage power unit 30, and protrudes from a top surface or a bottom surface of the case 10.

In one or more embodiments, the low-voltage output terminal 31 may be disposed on the top surface when the second air duct 12 is located above the first air duct 11. The low-voltage output terminal 31 may be disposed on the bottom surface when the second air duct 12 is located below the first air duct 11. However, appropriate adjustments can be made during the actual use as well, as long as it facilitates the interconnection of the low-voltage output terminals 31 between a plurality of power modules, or the plugging and unplugging of the power modules.

In one or more embodiments, the high-voltage input terminals 21 are located on both side surfaces or a rear portion of the case 10, which can facilitate the interconnections of the high-voltage input terminals 21 between a plurality of power modules, or the plugging and unplugging of the power modules.

In some embodiments, the isolating part 50 is a straight plate. The high-voltage power unit 20 and the low-voltage power unit 30 are sequentially disposed in the height direction of the case 10. That is, the high-voltage power unit 20 and the low-voltage power unit 30 are directly stacked in a vertical direction.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope of the disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:
1. A power module, comprising:
a case and an isolating part disposed in the case;
a first air duct and a second air duct stacked to each other, separated by the isolating part, and penetrated in a front-to-rear direction in the case;
a high-voltage power unit;
a low-voltage power unit; and
a transformer, comprising a high-voltage portion and a low-voltage portion, wherein the high-voltage portion comprises a first magnetic core and a high-voltage coil disposed on the first magnetic core, and the low-voltage portion comprises a second magnetic core and a low-voltage coil disposed on the second magnetic core,
wherein the high-voltage power unit and the high-voltage portion are disposed in the first air duct, the low-voltage power unit and the low-voltage portion are disposed in the second air duct, the high-voltage coil is electrically connected to the high-voltage power unit, and the low-voltage coil is electrically connected to the low-voltage power unit.

2. The power module according to claim 1, wherein the isolating part is formed of insulating material and the power module further comprises:

semi-conductive layers, disposed on both sides of the isolating part, wherein the high-voltage portion and the low-voltage portion are respectively in contact with the semi-conductive layers on said both sides of the isolating part.

3. The power module according to claim 2, wherein the semi-conductive layers are disposed in regions in which the semi-conductive layers are in contact with the first magnetic core and the second magnetic core on said both sides of the isolating part.

4. The power module according to claim 1, wherein the transformer comprises a main transformer and an auxiliary transformer, the high-voltage portion comprises a main high-voltage portion and an auxiliary high-voltage portion, and the low-voltage portion comprises a main low-voltage portion and an auxiliary low-voltage portion,
wherein the main high-voltage portion and the main low-voltage portion are the high-voltage portion and the low-voltage portion of the main transformer, the auxiliary high-voltage portion and the auxiliary low-voltage portion are the high-voltage portion and the low-voltage portion of the auxiliary transformer, and the main high-voltage portion and the auxiliary high-voltage portion are electrically connected to the high-voltage power unit, and the main low-voltage portion and the auxiliary low-voltage portion are electrically connected to the low-voltage power unit.

5. The power module according to claim 1, wherein further comprising:
a fan assembly, comprising a fan having an air inlet/outlet in communication with both a front portion of the first air duct and a front portion of the second air duct.

6. The power module according to claim 5, wherein the fan comprises:
a first fan, located in the front portions of the first air duct and the second air duct, wherein an air-in/out direction of the first fan is parallel to a length direction of the case.

7. The power module according to claim 6, wherein the fan further comprises:
a second fan, located in the front portions of the first air duct and the second air duct, and disposed side by side with the first fan.

8. The power module according to claim 7, wherein an air inlet/outlet of the second fan is inclined relative to the air inlet/outlet of the first fan, and is inclined towards the front portions of the first air duct and the second air duct.

9. The power module according to claim 7, wherein the air inlet/outlet of the second fan is disposed parallel to the air inlet/outlet of the first fan, and the fan assembly further comprises:
an air guide plate, inclined relative to the air inlet/outlet of the second fan, such that air blown into or sucked out of the air inlet/outlet of the second fan passes through the first air duct and the second air duct via the air guide plate.

10. The power module according to claim 5, wherein the fan assembly is disposed on a side of the case close to the low-voltage power unit.

11. The power module according to claim 10, wherein the fan assembly is disposed in the case, and the power module further comprises:
a first partition plate, disposed close to the fan assembly in the first air duct, wherein both the high-voltage power unit and the high-voltage portion are located on a same side of the first partition plate and on a side opposite to the side on which the fan assembly is located,
wherein a first air guide hole in communication with the front portion of the first air duct is disposed on the first partition plate.

12. The power module according to claim 10, wherein the fan assembly further comprises:
a mounting portion, wherein the fan is disposed in the mounting portion, and the mounting portion is connected to the case,
wherein an air vent in communication with the first air duct and the second air duct is disposed on the mounting portion.

13. The power module according to claim 12, wherein at least a portion of the air vent is an opening, and the power module further comprises:
a second partition plate, disposed on the mounting portion, and configured to block a part of the opening,
wherein a second air guide hole in communication with the front portion of the first air duct is disposed on the second partition plate.

14. The power module according to claim 1, wherein the isolating part is a bent plate, and the high-voltage power unit and the low-voltage power unit are successively disposed in a length direction of the case.

15. The power module according to claim 14, wherein the isolating part comprises:
a first plate, disposed on the case, and extending in the length direction of the case;
a second plate, disposed on the case, and extending in the length direction of the case, wherein the first plate and the second plate are successively disposed in a height direction of the case; and
a third plate, disposed on the case, and configured to connect the first plate and the second plate, wherein the third plate is obliquely disposed relative to the first plate and the second plate,
wherein the high-voltage power unit and the low-voltage power unit are respectively located on both sides of the third plate.

16. The power module according to claim 15, wherein the high-voltage portion and the low-voltage portion are respectively located on both sides of the first plate; or the high-voltage portion and the low-voltage portion are respectively located on both sides of the second plate; or the high-voltage portion and the low-voltage portion are respectively located on said both sides of the third plate.

17. The power module according to claim 15, further comprising:
a third partition plate, disposed in the second air duct, and configured to divide the second air duct into two parts, wherein both the low-voltage power unit and the low-voltage portion are located on a same side of the third partition plate,
wherein a third air guide hole is disposed on the third partition plate.

18. The power module according to claim 15, wherein the first plate is located above the second plate,
wherein the second air duct and the first air duct are respectively located on an upper side and a lower side of the first plate, the third plate and the second plate, and the high-voltage power unit is located below the first plate, the low-voltage power unit is located above the second plate; or,
the first air duct and the second air duct are respectively located on the upper side and the lower side of the first plate, the third plate and the second plate, and the low-voltage power unit is located below the first plate, the high-voltage power unit is located above the second plate.

19. The power module according to claim 18, wherein the power module further comprises:
  a high-voltage input terminal, electrically connected to the high-voltage power unit, and protruding from a side surface or a rear portion of the case; and
  a low-voltage output terminal, electrically connected to the low-voltage power unit, and protruding from a top surface or a bottom surface of the case.

20. The power module according to claim 1, wherein the isolating part is a straight plate, and the high-voltage power unit and the low-voltage power unit are disposed in a height direction of the case.

* * * * *